United States Patent
Lu

(10) Patent No.: US 8,988,389 B2
(45) Date of Patent: Mar. 24, 2015

(54) TOUCH PANEL AND MANUFACTURING METHOD THEREOF

(71) Applicant: Emerging Display Technologies Corp., Kaohsiung (TW)

(72) Inventor: Chih-Hung Lu, Hualien County (TW)

(73) Assignee: Emerging Display Technologies Corp. (TW)

( * ) Notice: Subject to any disclaimer, the term of this patent is extended or adjusted under 35 U.S.C. 154(b) by 88 days.

(21) Appl. No.: 13/926,334

(22) Filed: Jun. 25, 2013

(65) Prior Publication Data

US 2014/0375904 A1    Dec. 25, 2014

(51) Int. Cl.
G06F 3/041 (2006.01)
G06F 3/044 (2006.01)
H05K 3/02 (2006.01)
H05K 3/06 (2006.01)

(52) U.S. Cl.
CPC ............... *G06F 3/041* (2013.01); *G06F 3/044* (2013.01); *H05K 3/02* (2013.01); *H05K 3/06* (2013.01)
USPC ........................................................ 345/174

(58) Field of Classification Search
None
See application file for complete search history.

(56) References Cited

U.S. PATENT DOCUMENTS

| 8,816,982 B2* | 8/2014 | Kim et al. ................ 345/173 |
| 2012/0024816 A1* | 2/2012 | Huang et al. ................ 216/13 |
| 2013/0257519 A1* | 10/2013 | Chuang et al. ............... 327/517 |
| 2014/0217059 A1* | 8/2014 | Park ............................ 216/13 |

* cited by examiner

*Primary Examiner* — Joseph Haley
(74) *Attorney, Agent, or Firm* — Lerner, David, Littenberg, Krumholz & Mentlik, LLP

(57) ABSTRACT

The present invention relates to a touch panel and a manufacturing method thereof. The method comprises steps of providing a base having a substrate, a buffering layer and a transparent conductive layer, forming multiple first pad strings, multiple second pads and an isolated pad by etching the transparent conductive layer, forming a shading layer on the isolated pad and then sequentially forming insulating layers, wire bridges, signal wires and cover pieces to complete the touch panel. The method of the invention is simplified, such that the production capacity is increased. The step of forming the shading layer is after the step of forming the first pad strings and the second pads, such that the shading layer would not be charred in the step of forming first pad strings and the second pads.

14 Claims, 7 Drawing Sheets

TOUCH PANEL AND MANUFACTURING METHOD THEREOF

BACKGROUND OF THE INVENTION

1. Field of the Invention

The present invention relates to a touch panel and a manufacturing method for manufacturing the touch panel. The manufacturing method is simplified to increase the production capacity.

2. Description of Related Art

With reference to FIG. 5A, a first step of a conventional touch panel manufacturing method is to provide a substrate 20. The substrate 20 can be a transparent glass substrate.

With reference to FIG. 5B, a second step of the conventional method is to form a buffering layer 21 on the substrate 20. The buffering layer 21 has a surface including an active area and a wiring area around the active area.

With reference to FIG. 5C, after the buffering layer 21 is formed, a third step of the conventional method is to form a black matrix layer 22 on the wiring area of the buffering layer 21.

With reference to FIGS. 5D and 6, after the black matrix layer 22 is formed, a fourth step of the conventional method is to form a transparent conductive layer on the buffering layer 21. The transparent conductive layer is then etched to form multiple first pad strings 23, multiple second pads 24 and multiple signal wires 25. The first pad strings 23 and the second pads 24 are formed on the active area of the buffering layer 21. The signal wires 25 are formed on the wiring area of the buffering layer 21. Each first pad string 23 has multiple first pads 231 and multiple connecting wires 232. Each connecting wire 232 is electrically connected between each two adjacent first pads 231. The signal wires 25 are respectively connected to the first pads 231 and the second pads 24. The first pads 231 and the second pads 24 can be ITO (Indium Tin Oxide) pads.

With reference to FIG. 5E, after the first pad strings 23, the second pads 24 and the signal wires 25 are formed, a fifth step of the conventional method is to form an insulating layer 26 on each connecting wire 232.

With reference to FIGS. 5F and 7, after the insulating layers 26 are formed, a sixth step of the conventional method is to form a wire bridge 27 on each insulating layer 26 and to form a metal wire 28 on a surface of each signal wire 25. Each wire bridge 27 is electrically connected between each two adjacent second pads 24.

With reference to FIG. 5G, after the metal wires 28 and the wire bridges 27 are formed, a seventh step of the conventional method is to form cover pieces 29 to respectively cover the metal wires 28 and the wire bridges 27, such that the metal wires 28 and the wire bridges 27 are isolated from the external environment. After the cover pieces 29 are formed, a conventional touch panel is completed.

However, the process to form the first pad strings 23 and the second pads 24 is complicated, including the steps of forming the buffering layer 21 on the substrate 20, forming the transparent conductive layer on the buffering layer 21 and etching the transparent conductive layer. As a result, the production capacity for the conventional touch panel can hardly be increased.

In addition, the step of forming the first pad strings 23 and the second pads 24 is after the step of forming the black matrix layer 22. The processing temperature of forming the first pad strings 23 and the second pads 24 may cause charring of the black matrix layer 22, thereby polluting an ITO-film formation chamber. On the other hand, the charred black matrix layer 22 becomes conductive. The signal wires 25 may be connected to each other and lead to a short circuit, such that the quality of the conventional touch panel is affected.

BRIEF SUMMARY OF THE INVENTION

An objective of the prevent invention is to provide a touch panel and a manufacturing method of the touch panel. The production capacity for the touch panel is increased because the manufacturing method of the invention is simplified. The shading layer of the touch panel is prevented from being charred to assure quality of the touch panel.

The touch panel of the invention comprises a substrate, a buffering layer, an isolated pad, a shading layer, multiple first pad strings, multiple second pads, multiple insulating layers, multiple wire bridges, multiple signal wires and multiple cover pieces.

The buffering layer is formed on the substrate and has an active area and a wiring area around the active area. The isolated pad is formed on the wiring area. The shading layer is formed on the isolated pad.

The first pad strings are formed on the active area of the buffering layer and are electrically insulated from the isolated pad. Each first pad string comprises multiple first pads and multiple connecting wires. Each connecting wire is electrically connected between each two adjacent first pads. The second pads are formed on the active area of the buffering layer and are electrically insulated from the isolated pad and the first pad strings.

The insulating layers are respectively formed on the connecting wires to cover the connecting wires. The wire bridges are respectively formed on the insulating layers. Each wire bridge is electrically connected between each two adjacent second pads. The signal wires are formed on the shading layer and are respectively and electrically connected to the first pads and the second pads. The cover pieces respectively cover the wire bridges and the signal wires.

The manufacturing method for manufacturing the touch panel of the invention comprises the steps of:

providing a base having a substrate, a buffering layer formed on the substrate, and a transparent conductive layer formed on the buffering layer, wherein the buffering layer has a surface including an active area and a wiring area around the active area;

forming an isolated pad, multiple first pad strings and multiple second pads by etching the transparent conductive layer, the isolated pad formed on the wiring area, the first pad strings and the second pads formed on the active area, and the isolated pad, the first pad strings and the second pads electrically insulated from each other, wherein each first pad string comprises:

multiple first pads; and multiple connecting wires, each connecting wire connected between each two adjacent first pads;

forming a shading layer on the isolated pad;

forming an insulating layer on each connecting wire;

forming multiple signal wires and multiple wire bridges, wherein the signal wires are formed on the shading layer and are respectively and electrically connected to the first pads and the second pads; and the wire bridges are respectively formed on the insulating layers, and each wire bridge is electrically connected between each two adjacent second pads; and forming cover pieces covering the shading layer, the signal wires and the wire bridges to complete a touch panel.

In the step of providing the base, the base already has the buffering layer and the transparent conductive layer formed on the base, such that the steps of forming the buffering layer and the transparent conductive layer of the conventional method are omitted. The manufacturing method of the invention is thus simplified and the production capacity is increased. In addition, the step of forming the shading layer is after the step of forming the first pad strings and the second pads. Hence, the shading layer would not be charred in the step of forming the first pad strings and the second pads. The quality of the touch panel of the invention is assured.

DETAILED DESCRIPTION OF PREFERRED EMBODIMENT

Figure 1:
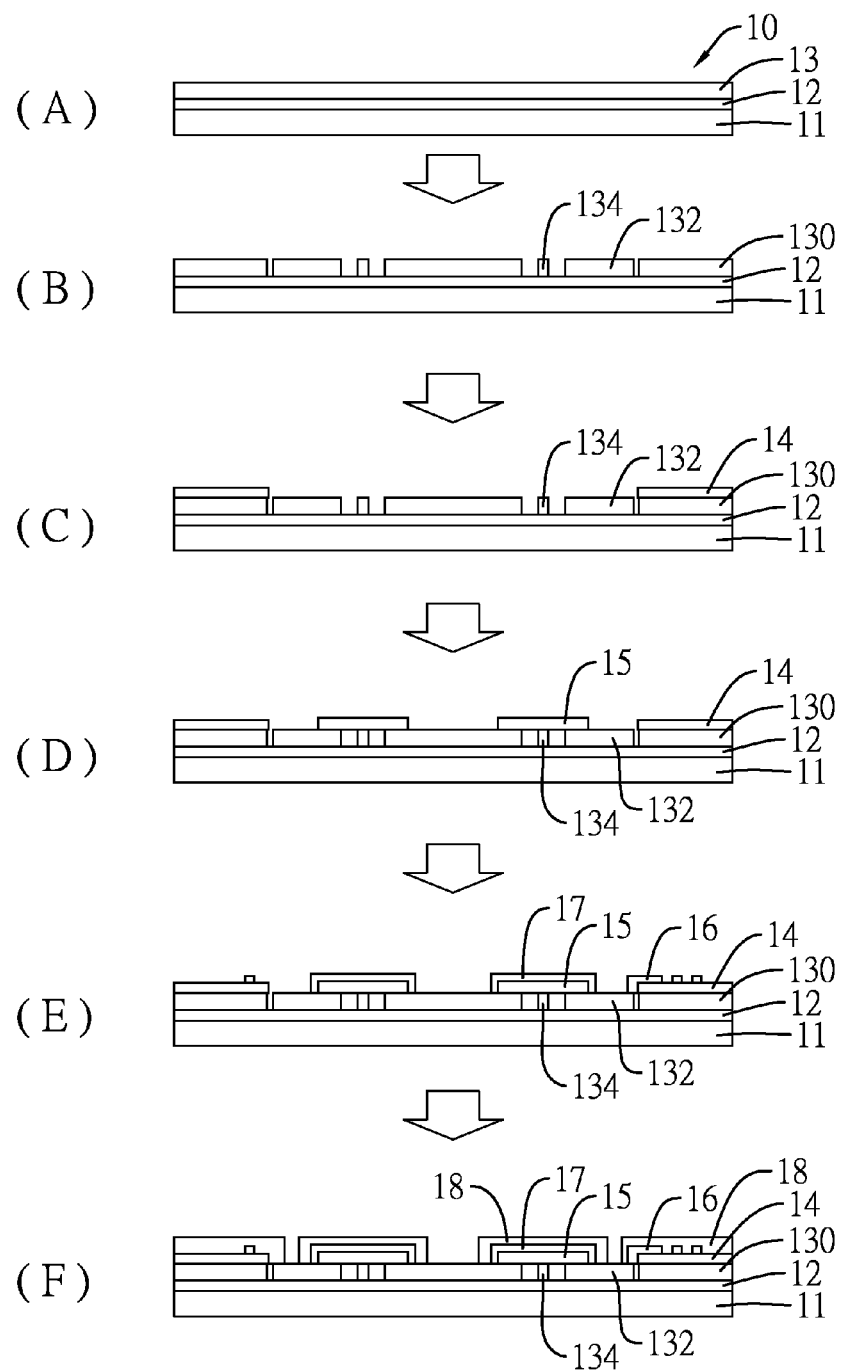
FIGS. 1A-1F are plan views of a touch panel in respective steps of the manufacturing method of the invention.

With reference to FIG. 1A, a first step of the manufacturing method of the invention is to provide a base 10. The base 10 comprises a substrate 11, a buffering layer 12 and a transparent conductive layer 13. The buffering layer 12 is formed on the substrate 11. The transparent conductive layer 13 can be an ITO (Indium Tin Oxide) layer and is formed on the buffering layer 12. The buffering layer 12 has a surface including an active area and a wiring area around the active area.

Figure 2:
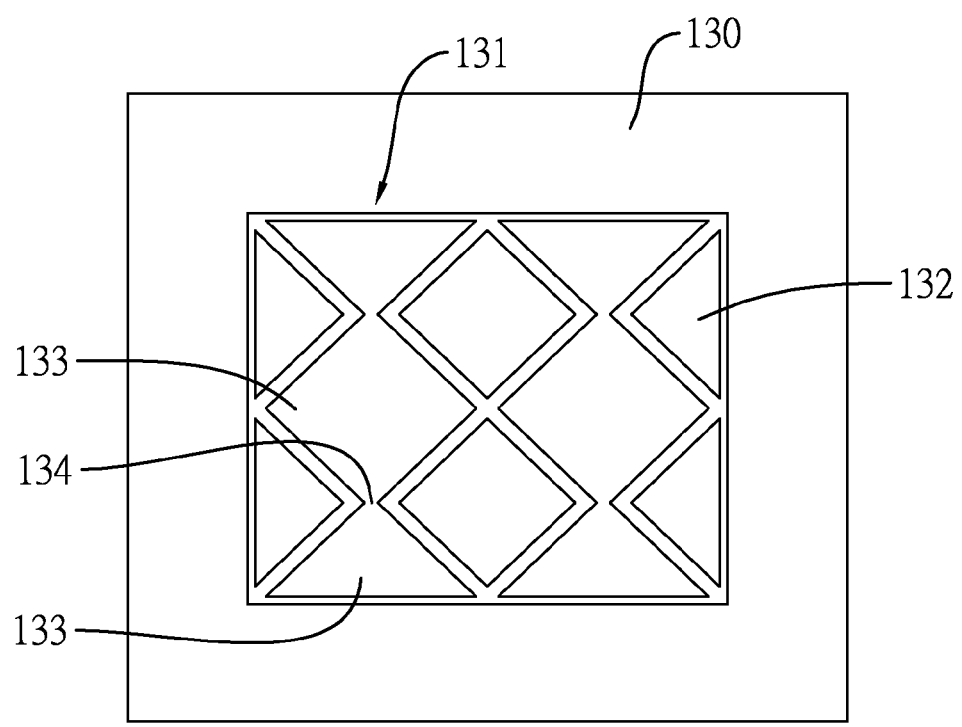
FIG. 2 is a plan view of the touch panel in the step of forming an isolated pad, first pad strings and second pads of the invention.

With reference to FIGS. 1B and 2, a second step of the invention is to form an isolated pad 130, multiple first pad strings 131 and multiple second pads 132 by etching the transparent conductive layer 13. The isolated pad 130 is formed on the wiring area. The first pad strings 131 and the second pads 132 are formed on the active area. The isolated pad 130, the first pad strings 131 and the second pads 132 are electrically insulated from each other. Each first pad string 131 comprises multiple first pads 133 and multiple connecting wires 134. Each connecting wire 134 is connected between each two adjacent first pads 131. In this embodiment, the first pads 133 and the second pads 132 are ITO (Indium Tin Oxide) pads.

With reference to FIG. 1C, after the isolated pad 130, the first pad strings 131 and the second pads 132 are formed, a third step of the invention is to form a shading layer 14 on the isolated pad 130, wherein the shading layer 14 can be a black matrix (BM) layer. A width of the shading layer 14 can be slightly wider than a width of the isolated pad 130.

With reference to FIG. 1D, after the shading layer 14 is formed, a fourth step of the invention is to form an insulating layer 15 on each connecting wire 134.

Figure 3:
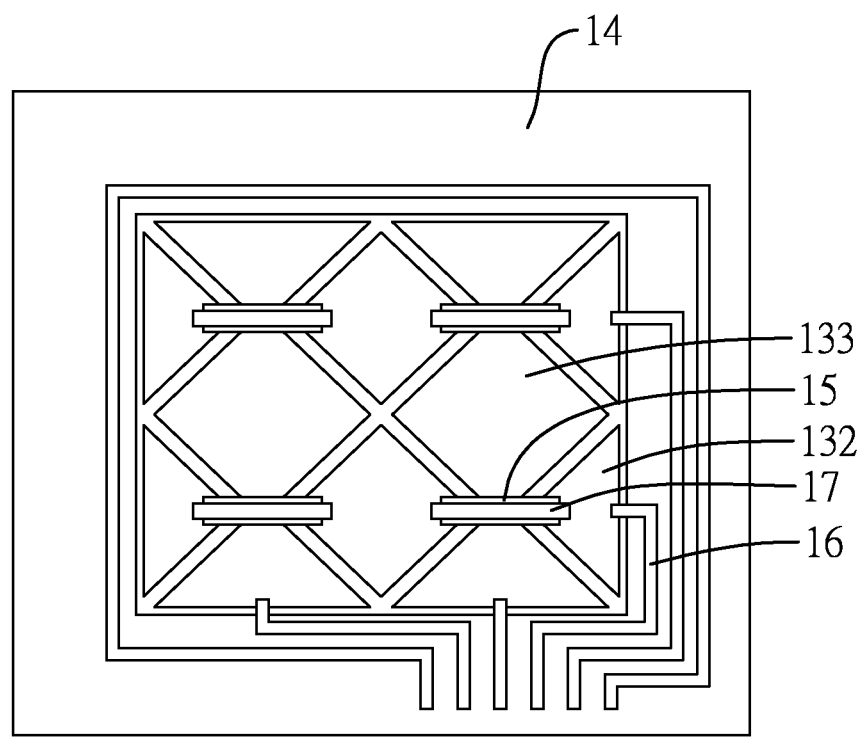
FIG. 3 is a plan view of the touch panel in the step of forming wire bridges and signal wires of the invention.

With reference to FIGS. 1E and 3, after the insulating layers 15 are formed, a fifth step of the invention is to form multiple signal wires 16 on the shading layer 14 and form a wire bridge 17 on each insulating layer 15. Each wire bridge 17 is electrically connected between each two adjacent second pads 132 to form multiple second pad strings. The second pad strings are formed across and are insulated from the first pad strings 131. In this embodiment, the signal wires 16 respectively extend from a surface of the shading layer 14 to surfaces of the first pads 133 and the second pads 132, such that the signal wires 16 are respectively and electrically connected to the first pads 133 and the second pads 132.

Figure 4:
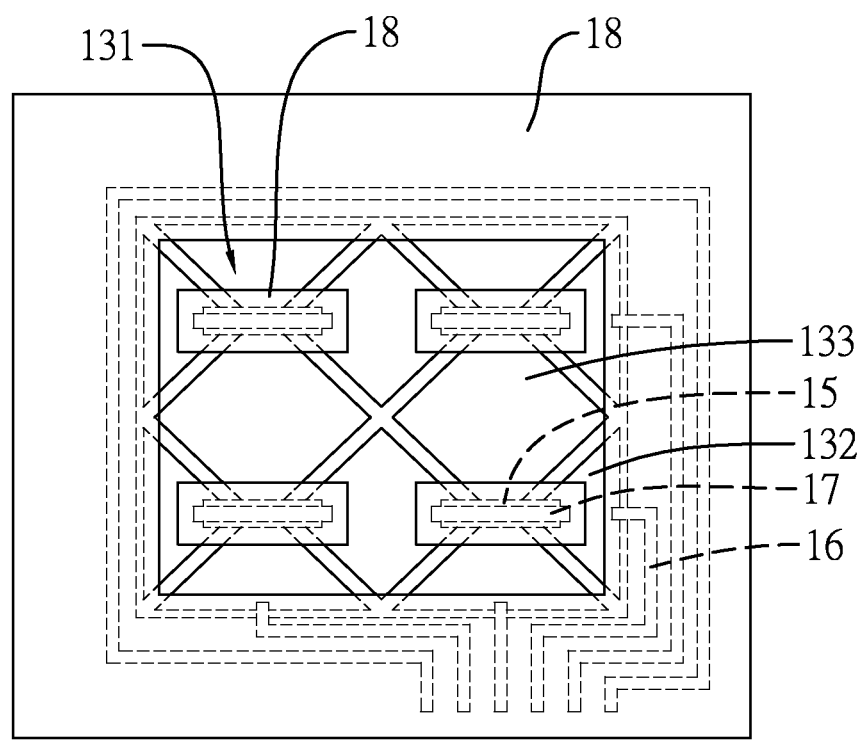
FIG. 4 is a plan view of the touch panel in the step of forming cover pieces of the invention.
Figure 5:
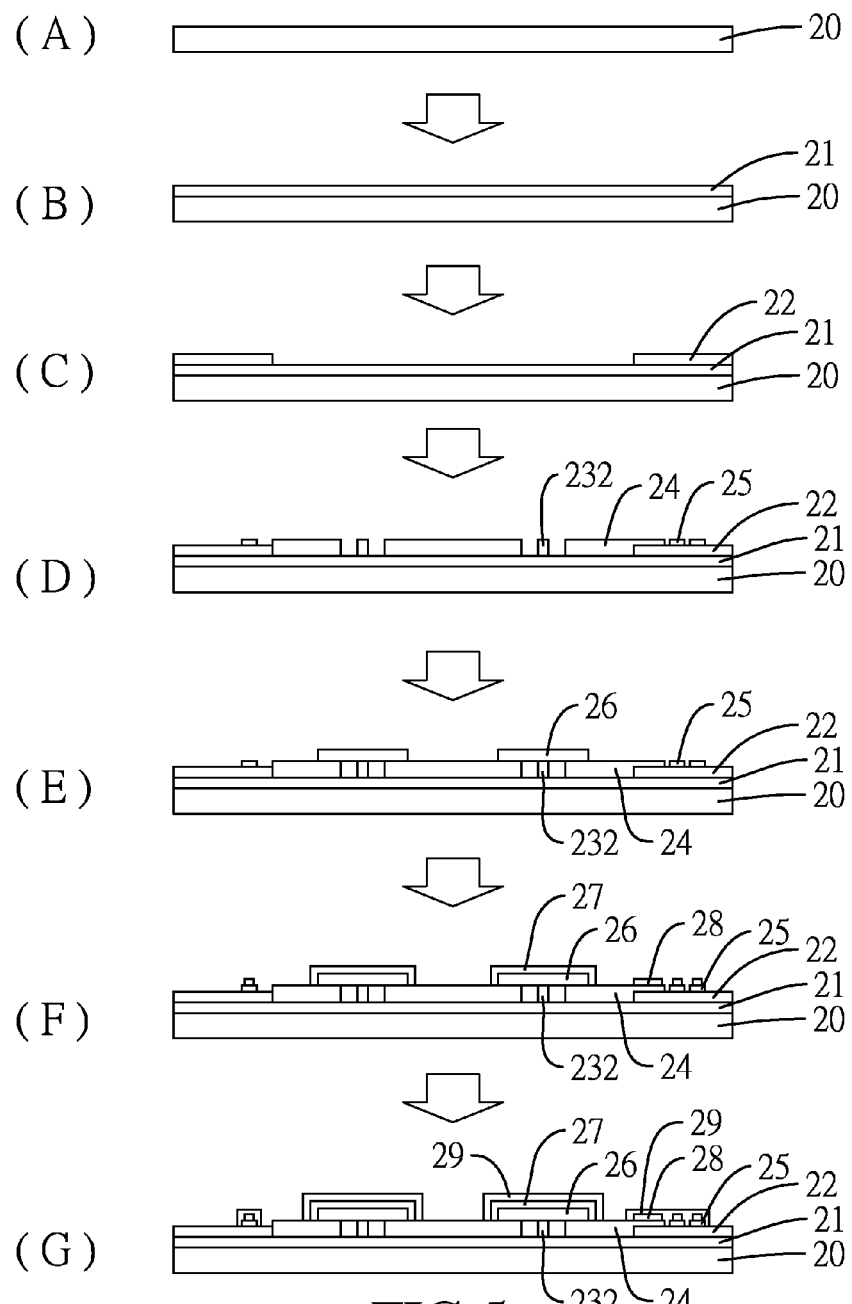
FIGS. 5A-5G are plan views of a conventional touch panel in respective steps of a conventional manufacturing method.
Figure 6:
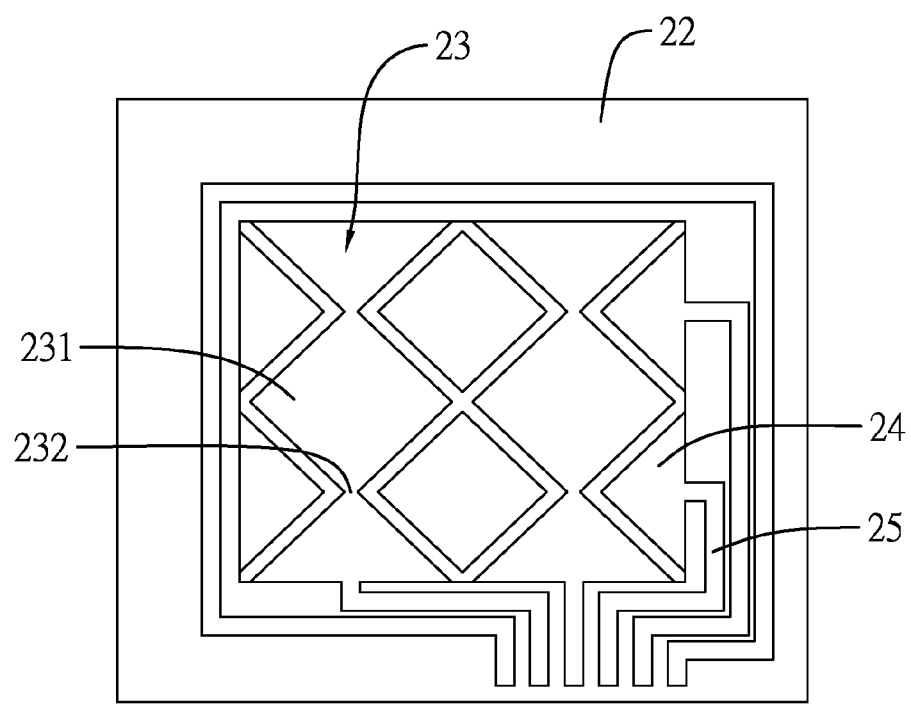
FIG. 6 is a plan view of the conventional touch panel in the step of forming first pad strings and second pads.
Figure 7:
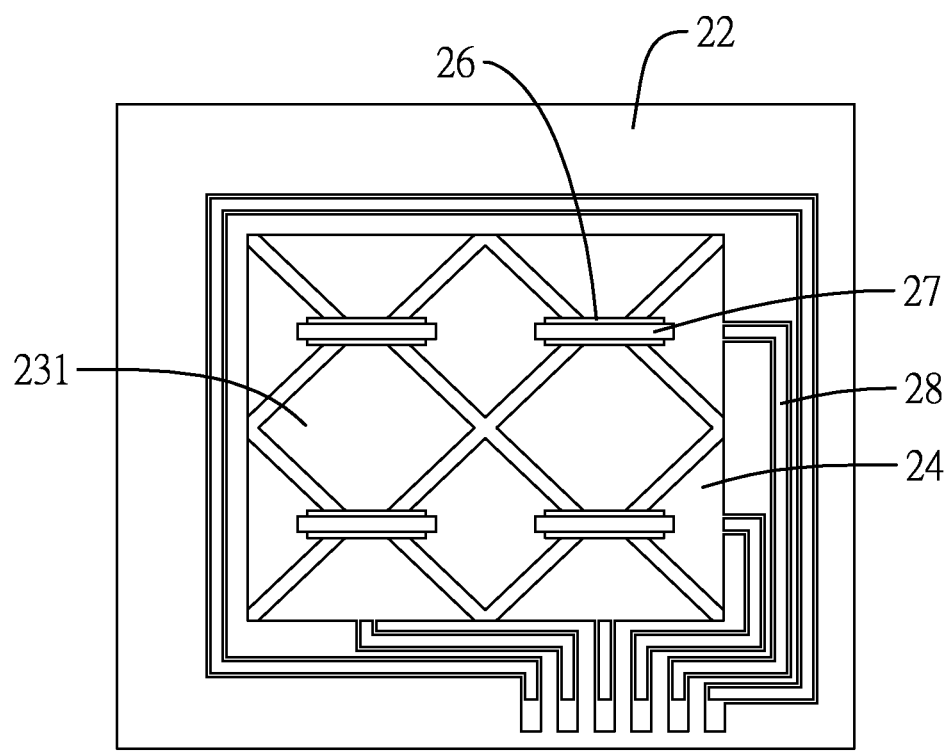
FIG. 7 is a plan view of the conventional touch panel in the step of forming wire bridges and metal wires.

With reference to FIGS. 1F and 4, after the signal wires 16 and the wire bridges 17 are formed, a sixth step of the invention is to form cover pieces 18 to respectively cover the shading layer 14, the signal wires 16 and the wire bridges 17, such that the shading layer 14, the signal wires 16 and the wire bridges 17 are isolated from the external environment. After the cover pieces 18 are formed, a touch panel is completed.

With reference to FIGS. 1F and 4, the touch panel manufactured by the steps as mentioned above comprises a substrate 11, a buffering layer 12, an isolated pad 130, a shading layer 14, multiple first pad strings 131, multiple second pads 132, multiple insulating layers 15, multiple wire bridges 17, multiple signal wires 16 and multiple cover pieces 18.

The substrate 11 can be a transparent glass substrate.

The buffering layer 12 is formed on a surface of the substrate 11. The buffering layer 12 has a surface including an active area and a wiring area around the active area.

The isolated pad 130 is formed on the wiring area.

The shading layer 14 is formed on the isolated pad 130. A width of the shading layer 14 can be slightly wider than a width of the isolated pad 130.

The first pad strings 131 are formed on the active area of the buffering layer 12 in parallel. Each first pad string 131 comprises multiple first pads 133 and multiple connecting wires 134. Each connecting wire 134 is electrically connected between each two adjacent first pads 133. The first pad strings 131 are electrically insulated from the isolated pad 130.

The second pads 132 are formed on the active area of the buffering layer 12 and are electrically insulated from the isolated pad 130 and the first pad strings 131. In this embodiment, the isolated pad 130, the first pads 133 and the second pads 132 are ITO (Indium Tin Oxide) pads.

The insulating layers 15 are respectively formed on the connecting wires 134 to cover the connecting wires 134.

The wire bridges 17 are respectively formed on the insulating layers 15, such that each wire bridge 17 is electrically connected between each two adjacent second pads 132. In this embodiment, the wire bridges 17 are transparent wires, such as ITO (Indium Tin Oxide) wires, nano-silver wires, nano-copper wires and ZnO (Zinc Oxide) wires.

The signal wires 16 are formed on the shading layer 14 and are respectively connected to the first pads 133 and the second pads 132. The signal wires 16 respectively extend from a surface of the shading layer 14 to surfaces of the first pads 133 and the second pads 132. In this embodiment, the signal wires 16 are transparent wires, such as ITO (Indium Tin Oxide) wires, nano-silver wires, nano-copper wires and ZnO (Zinc Oxide) wires.

The cover pieces 18 respectively cover the wire bridges 17 and the signal wires 16.

In conclusion, in the step of providing the base 10, the base 10 already has the substrate 11, the buffering layer 12 and the transparent conductive layer 13 formed on the base. In this manufacturing method of the invention, the steps of forming the buffering layer 12 and the transparent conductive layer 13 are omitted, such that the manufacturing method of the invention is simplified and the production capacity for the touch panel of the invention is increased. In addition, the first pad strings 131 and the second pads 132 are formed prior to forming the shading layer 14. Therefore, the shading layer 14 of course would not be charred in the step of forming the first pad strings 131 and the second pads 132. The quality of the touch panel of the invention is assured.

What is claimed is:

1. A touch panel comprising:
   a substrate;
   a buffering layer formed on the substrate and having an active area and a wiring area around the active area;
   an isolated pad formed on the wiring area;
   a shading layer formed on the isolated pad;
   multiple first pad strings formed on the active area of the buffering layer and electrically insulated from the isolated pad, each first pad string comprising
   multiple first pads; and
   multiple connecting wires, wherein each connecting wire is electrically connected between each two adjacent first pads;
   multiple second pads formed on the active area of the buffering layer and electrically insulated from the isolated pad and the first pad strings;
   multiple insulating layers respectively formed on the connecting wires to cover the connecting wires;
   multiple wire bridges respectively formed on the insulating layers, wherein each wire bridge is electrically connected between each two adjacent second pads;
   multiple signal wires formed on the shading layer and respectively and electrically connected to the first pads and the second pads; and
   multiple cover pieces respectively covering the wire bridges and the signal wires.

2. The touch panel as claimed in claim 1, wherein the signal wires respectively extend from a surface of the shading layer to surfaces of the first pads and the second pads.

3. The touch panel as claimed in claim 1, wherein the isolated pad, the first pads and the second pads are ITO (Indium Tin Oxide) pads.

4. The touch panel as claimed in claim 2, wherein the isolated pad, the first pads and the second pads are ITO (Indium Tin Oxide) pads.

5. The touch panel as claimed in claim 3, wherein a width of the shading layer is wider than a width of the isolated pad.

6. The touch panel as claimed in claim 4, wherein a width of the shading layer is wider than a width of the isolated pad.

7. The touch panel as claimed in claim 1, wherein the wire bridges and the signal wires are transparent.

8. The touch panel as claimed in claim 2, wherein the wire bridges and the signal wires are transparent.

9. The touch panel as claimed in claim 7, wherein
   the wire bridges are selected from a group consisting of ITO (Indium Tin Oxide) wires, nano-silver wires, nano-copper wires and ZnO (Zinc Oxide) wires; and
   the signal wires are selected from a group consisting of ITO (Indium Tin Oxide) wires, nano-silver wires, nano-copper wires and ZnO (Zinc Oxide) wires.

10. The touch panel as claimed in claim 8, wherein
    the wire bridges are selected from a group consisting of ITO (Indium Tin Oxide) wires, nano-silver wires, nano-copper wires and ZnO (Zinc Oxide) wires; and
    the signal wires are selected from a group consisting of ITO (Indium Tin Oxide) wires, nano-silver wires, nano-copper wires and ZnO (Zinc Oxide) wires.

11. A manufacturing method of a touch panel, the manufacturing method comprising the steps of:
    providing a base having a substrate, a buffering layer formed on the substrate, and a transparent conductive layer formed on the buffering layer, wherein the buffering layer has a surface including an active area and a wiring area around the active area;
    forming an isolated pad, multiple first pad strings and multiple second pads by etching the transparent conductive layer, the isolated pad formed on the wiring area, the first pad strings and the second pads formed on the active area, and the isolated pad, the first pad strings and the second pads electrically insulated from each other, wherein each first pad string comprises:
    multiple first pads; and
    multiple connecting wires, each connecting wire connected between each two adjacent first pads;
    forming a shading layer on the isolated pad;
    forming an insulating layer on each connecting wire;
    forming multiple signal wires and multiple wire bridges, wherein
    the signal wires are formed on the shading layer and are respectively and electrically connected to the first pads and the second pads; and
    the wire bridges are respectively formed on the insulating layers, and each wire bridge is electrically connected between each two adjacent second pads; and
    forming cover pieces covering the shading layer, the signal wires and the wire bridges to complete a touch panel.

12. The manufacturing method as claimed in claim 11, wherein in the step of forming the signal wires, the signal wires respectively extend from a surface of the shading layer to surfaces of the first pads and the second pads.

13. The manufacturing method as claimed in claim 12, wherein the first pads and the second pads are ITO (Indium Tin Oxide) pads.

14. The manufacturing method as claimed in claim 13, wherein the wire bridges and the signal wires are transparent.

* * * * *